(12) United States Patent
Shimizu et al.

(10) Patent No.: US 12,189,193 B2
(45) Date of Patent: Jan. 7, 2025

(54) SEMICONDUCTOR PACKAGE

(71) Applicant: IBIDEN CO., LTD., Gifu (JP)

(72) Inventors: Keisuke Shimizu, Ogaki (JP); Tomoyuki Ikeda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 147 days.

(21) Appl. No.: 17/821,534

(22) Filed: Aug. 23, 2022

(65) Prior Publication Data

US 2023/0076560 A1   Mar. 9, 2023

(30) Foreign Application Priority Data

Sep. 7, 2021   (JP) ................................. 2021-145088

(51) Int. Cl.
*G02B 6/42*   (2006.01)
*H01L 25/16*   (2023.01)

(52) U.S. Cl.
CPC ........... *G02B 6/4214* (2013.01); *G02B 6/428* (2013.01); *H01L 25/167* (2013.01)

(58) Field of Classification Search
CPC ...................................................... G02F 1/093
USPC ........................................................... 385/14
See application file for complete search history.

(56) References Cited

U.S. PATENT DOCUMENTS

| | | | | |
|---|---|---|---|---|
| 6,684,007 B2 * | 1/2004 | Yoshimura | ............... | G02B 6/43 257/E25.032 |
| 6,690,845 B1 * | 2/2004 | Yoshimura | ............. | G02B 6/124 257/E25.032 |
| 7,490,993 B2 * | 2/2009 | Pitwon | ................. | G02B 6/4249 398/135 |
| 2002/0097962 A1 * | 7/2002 | Yoshimura | ............. | G02B 6/124 385/16 |
| 2004/0146238 A1 * | 7/2004 | Uchida | .................... | G02B 6/43 385/14 |
| 2011/0133063 A1 * | 6/2011 | Ji | ........................... | G02B 6/122 250/227.24 |
| 2014/0093211 A1 * | 4/2014 | McColloch | ............ | G02B 6/406 385/74 |
| 2014/0193160 A1 * | 7/2014 | Yagisawa | ............. | G02B 6/4284 398/136 |

FOREIGN PATENT DOCUMENTS

JP   2002-329891 A   11/2002

* cited by examiner

*Primary Examiner* — Kaveh C Kianni
(74) *Attorney, Agent, or Firm* — Oblon, McClelland, Maier & Neustadt, L.L.P.

(57) ABSTRACT

A semiconductor package includes a printed wiring board, a logic IC mounted on a first surface of the board, a connector mounted on a second surface of the board on the opposite side with respect to the first surface, an optical element that converts an optical signal and an electrical signal and positioned on the opposite side with respect to the first surface such that the optical element is at least partially embedded in the board, a path that is formed in the board and electrically connects the logic IC on the first surface and the optical element on the opposite side with respect to the first surface, and an optical waveguide that is embedded on the opposite side with respect to the first surface and optically connects the connector on the second surface and the optical element on the opposite side with respect to the first surface.

20 Claims, 3 Drawing Sheets

SEMICONDUCTOR PACKAGE

CROSS-REFERENCE TO RELATED APPLICATIONS

The present application is based upon and claims the benefit of priority to Japanese Patent Application No. 2021-145088, filed Sep. 7, 2021, the entire contents of which are incorporated herein by reference.

BACKGROUND OF THE INVENTION

Field of the Invention

A technology disclosed herein relates to a semiconductor package.

Description of Background Art

Japanese Patent Application Laid-Open Publication No. 2002-329891 describes an IC chip mounting substrate in which an optical element and an IC chip are mounted on a surface of a substrate. The entire contents of this publication are incorporated herein by reference.

SUMMARY OF THE INVENTION

According to one aspect of the present invention, a semiconductor package includes a printed wiring board, a logic IC mounted on a first surface of the printed wiring board, a connector mounted on a second surface of the printed wiring board on the opposite side of the printed wiring board with respect to the first surface, an optical element that converts an optical signal and an electrical signal and positioned on the opposite side of the printed wiring board with respect to the first surface such that the optical element is at least partially embedded in the printed wiring board, a path that is formed in the printed wiring board and electrically connects the logic IC on the first surface of the printed wiring board and the optical element on the opposite side of the printed wiring board with respect to the first surface, and an optical waveguide that is embedded on the opposite side of the printed wiring board with respect to the first surface and optically connects the connector on the second surface of the printed wiring board and the optical element on the opposite side of the printed wiring board with respect to the first surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
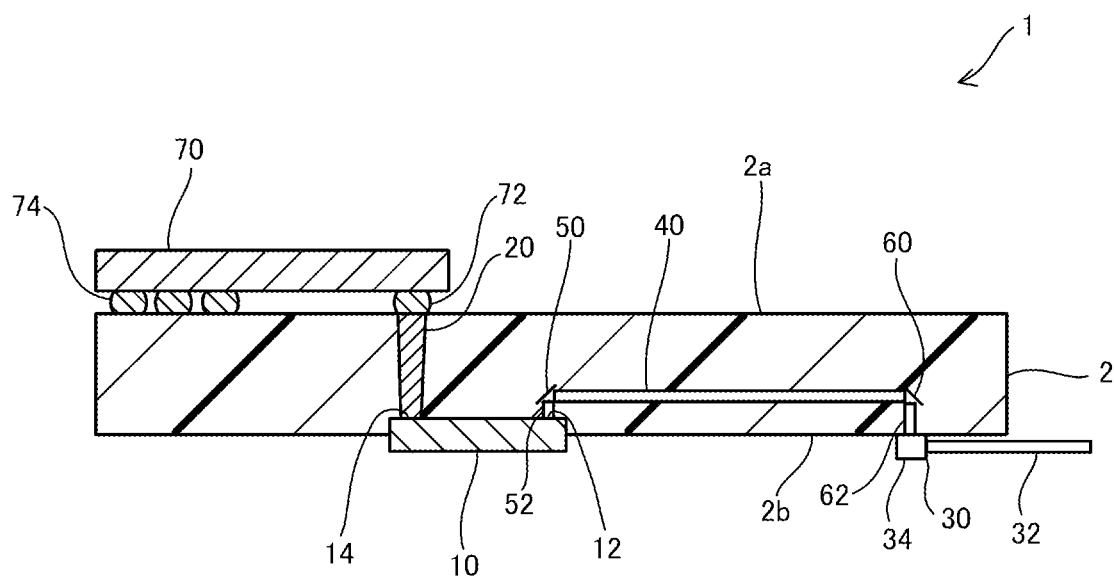
FIG. 1 is a cross-sectional view schematically illustrating a semiconductor package according to an embodiment of the present invention.

Embodiments will now be described with reference to the accompanying drawings, wherein like reference numerals designate corresponding or identical elements throughout the various drawings.

Semiconductor Package

FIG. 1 is a cross-sectional view illustrating a semiconductor package 1 according to an embodiment of the present invention. The semiconductor package 1 includes a printed wiring board 2, an optical element 10, a connector 30, an optical waveguide 40, and a logic IC 70.

The printed wiring board 2 is, for example, a wiring board including a build-up layer formed by alternately laminating conductor layers and resin insulating layers on a core substrate. The printed wiring board 2 has a first surface (2a) and a second surface (2b) on the opposite side with respect to the first surface (2a). An electronic component such as the logic IC 70 is mounted on the first surface (2a). The second surface (2b) is a surface for mounting the printed wiring board 2 on a motherboard (not illustrated in the drawings). The resin insulating layers are formed using a thermosetting resin. The resin insulating layers may contain inorganic particles such as silica particles, or may contain a reinforcing material such as a glass cloth. The conductor layers are formed mainly using copper. The conductor layers include wirings and the like (not illustrated in the drawings). The printed wiring board 2 has a thickness of, for example, about 1 mm. The printed wiring board 2 may have a thickness of 1 mm or more and 1.5 mm or less.

The optical element 10 is a component that converts an optical signal and an electrical signal. In the embodiment, the optical element 10 converts an input optical signal into an electrical signal and outputs the electrical signal (optical-electrical conversion), and converts an input electrical signal into an optical signal and outputs the optical signal (electrical-optical conversion). The optical element 10 performs both optical-electrical conversion and electrical-optical conversion. The optical element 10 includes a light receiving element that performs optical-electrical conversion, a light emitting element that performs electrical-optical conversion, and a control circuit that controls conversion between an optical signal and an electrical signal. The light receiving element is, for example, a photodiode. The light emitting element is, for example, a laser diode. The optical element 10 includes an optical input-output part 12 for inputting or outputting an optical signal and an electrical input-output part 14 for inputting or outputting an electrical signal. In a modified embodiment, the optical element 10 may be a component that performs only one of optical-electrical conversion and electrical-optical conversion.

The optical element 10 is positioned on the second surface (2b) side on the printed wiring board 2. A part (surface on the first surface (2a) side) of the optical element 10) is embedded in the printed wiring board 2. The remaining part (surface on the second surface (2b) side) of the optical element 10 protrudes from the second surface (2b). The optical input-output part 12 and the electrical input-output part 14 are positioned facing the first surface (2a). The optical input-output part 12 and the electrical input-output part 14 are embedded in the printed wiring board 2. A light transmitting member 52 (to be described later) is embedded in the printed wiring board 2 on the optical input-output part 12. A conductor via 20 is formed in the printed wiring board 2 on the electrical input-output part 14. The conductor via 20 is electrically connected to the electrical input-output part 14. An upper surface of the conductor via 20 is exposed on the first surface (2a). The conductor via 20 is formed substantially straight from the electrical input-output part 14 toward the first surface (2a). The conductor via 20 is formed substantially perpendicular to the first surface (2a). In a modified embodiment, a through-hole conductor may be formed instead of the conductor via 20.

The connector 30 is a component that connects an optical waveguide (optical fiber). In the embodiment, the connector 30 is mounted on the second surface (2b) of the printed wiring board 2. The connector 30 includes an optical fiber 32 and a housing 34. The optical fiber 32 is a member that transmits an optical signal. The optical fiber 32 has a length of, for example, 100 mm or more. The housing 34 is connected to an end part of the optical fiber 32. The housing 34 can be mounted on the second surface (2b). In the housing 34, a path (not illustrated in the drawings) is formed for guiding an optical signal output from the end part of the optical fiber 32 and guiding an optical signal input to the housing 34 to the end part of the optical fiber 32.

The optical waveguide 40 is a transmission path formed of a member that transmits an optical signal. The optical waveguide 40 is formed of an optical fiber. The optical waveguide 40 is formed between the optical element 10 and the connector 30. The optical waveguide 40 optically connects the optical element 10 and the connector 30. The optical waveguide 40 is embedded on the second surface (2b) side of the printed wiring board 2. The optical waveguide 40 extends along the second surface (2b). The optical waveguide 40 is formed parallel to the second surface (2b). The optical waveguide 40 has a length of 30 mm or more and 70 mm or less. In a modified embodiment, the length of the optical waveguide 40 may be 70 mm or more, or may be 30 mm or less.

A first mirror 50 and the light transmitting member 52 are provided between the optical waveguide 40 and the optical element 10. The light transmitting member 52 is a member that transmits an optical signal. The light transmitting member 52 is, for example, an optical pin formed of a transparent resin. The light transmitting member 52 is provided on an upper side (first surface (2a) side) of the optical input-output part 12 of the optical element 10. The optical input-output part 12 and the light transmitting member 52 are optically connected.

The first mirror 50 is a reflection member for changing a transmission direction of an optical signal transmitted between the optical waveguide 40 and the optical element 10. The first mirror 50 is positioned between an end part of the optical waveguide 40 and the light transmitting member 52. Therefore, the optical waveguide 40 is optically connected to the optical element 10 via the first mirror 50. An optical signal output from the end part of the optical waveguide 40 is changed in transmission direction by the first mirror 50 and is input to the optical input-output part 12 of the optical element 10 via the light transmitting member 52. Conversely, an optical signal output from the optical input-output part 12 of the optical element 10 is changed in transmission direction by the first mirror 50 and is input to the end part of the optical waveguide 40 via the light transmitting member 52.

A second mirror 60 and a light transmitting member 62 are provided between the optical waveguide 40 and the connector 30. The light transmitting member 62 is a member that transmits an optical signal. The light transmitting member 62 is, for example, an optical pin formed of a transparent resin. The light transmitting member 62 is provided in the printed wiring board 2 on an upper side of the housing 34 of the connector 30. The light transmitting member 62 is embedded on the second surface (2b) side of the printed wiring board 2. The housing 34 and the light transmitting member 62 are optically connected.

The second mirror 60 is a reflection member for changing a transmission direction of an optical signal transmitted between the optical waveguide 40 and the connector 30. The second mirror 60 is positioned between an end part of the optical waveguide 40 and the light transmitting member 62. Therefore, the optical waveguide 40 is optically connected to the connector 30 via the second mirror 60. An optical signal output from the end part of the optical waveguide 40 is changed in transmission direction by the second mirror 60 and is input to the connector 30 via the light transmitting member 62. Conversely, an optical signal output from the connector 30 is changed in transmission direction by the second mirror 60 and is input to the end part of the optical waveguide 40 via the light transmitting member 62.

The logic IC 70 is an IC chip that operates depending on an electrical signal. The logic IC 70 is, for example, a CPU. The logic IC 70 is mounted on the first surface (2a) of the printed wiring board 2. The logic IC 70 is mounted above a part of the optical element 10 in the printed wiring board 2. When the logic IC 70 and the optical element 10 are projected onto the first surface (2a) with light perpendicular to the first surface (2a), the logic IC 70 and the optical element 10 partially overlap. The logic IC 70 is mounted on the first surface (2a) via solder bumps (72, 74). The solder bump 72 is electrically connected to the upper surface of the conductor via 20 exposed on the first surface (2a). Therefore, the logic IC 70 is electrically connected to the optical element 10 via the solder bump 72 and the conductor via 20. The logic IC 70 and the optical element 10 transmit an electrical signal to each other via the solder bump 72 and the conductor via 20. The logic IC 70 operates using an electrical signal input (received) from the optical element 10 and outputs (transmits) an electrical signal to the optical element 10. The solder bumps 74 are electrically connected to other pads or the like on the first surface (2a) (not illustrated in the drawings).

Figure 2:
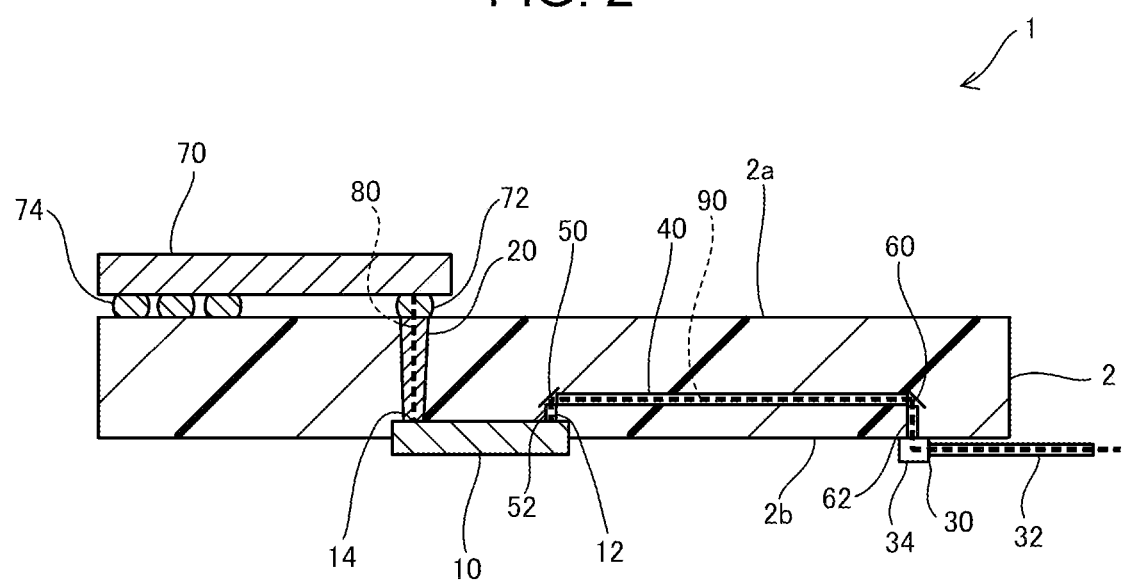
FIG. 2 is a cross-sectional view schematically illustrating an electrical path and an optical path in a semiconductor package according to an embodiment of the present invention.

FIG. 2 illustrates an electrical path 80 and an optical path 90 in the semiconductor package 1 of the embodiment. In the semiconductor package 1 of the embodiment, an electrical signal is transmitted between the electrical input-output part 14 of the optical element 10 and the logic IC 70 via the electrical path 80. The electrical path 80 is formed by the conductor via 20 and the solder bump 72. The electrical path 80 has a length of, for example, 0.5 mm or more and 1.5 mm or less. The electrical path 80 is formed substantially straight. The electrical path 80 is formed substantially perpendicular to the first surface (2a).

In the semiconductor package 1 of the embodiment, an optical signal is transmitted between the optical fiber 32 of the connector 30 and the optical input-output part 12 of the optical element 10 via the optical path 90. The optical path 90 is formed by the light transmitting member 52, the first mirror 50, the optical waveguide 40, the second mirror 60, the light transmitting member 62, the housing 34, and the optical fiber 32. A total length of the optical path 90 varies depending on a length of the optical fiber 32.

As described above, in the semiconductor package 1 of the embodiment, the logic IC 70 is mounted on the first surface (2a), and the optical element 10 is positioned on the second surface (2b) side. The electrical path 80 has a length of 0.5 mm or more and 1.5 mm or less. The length of the electrical path 80 is shorter than a length of an electrical path in a conventional semiconductor package. Therefore, according to the semiconductor package 1 of the embodiment, a transmission loss is smaller than that of a conventional semiconductor package.

Since the logic IC 70 is mounted on the first surface (2a) and the optical element 10 is positioned on the second surface (2b) side, a distance substantially equal to the thickness of the printed wiring board 2 exists between the logic IC 70 and the optical element 10. When the logic IC 70 and the optical element 10 are projected onto the first surface (2a) with light perpendicular to the first surface (2a), the logic IC 70 and the optical element 10 partially overlap. Therefore, even when the temperature of the logic IC 70 rises as the logic IC 70 operates, the optical element 10 is prevented from being affected by heat.

Method for Manufacturing Semiconductor Package

A method for manufacturing a semiconductor package 1 according to an embodiment of the present invention is described. The semiconductor package 1 of the embodiment is formed by the following processes. The printed wiring board 2 including the conductor via 20 is formed by alternately laminating conductor layers and resin insulating layers on a core substrate. Recesses for accommodating the optical element 10 and the optical waveguide 40 are formed on the second surface (2b) side of the printed wiring board 2. The optical element 10 and the optical waveguide 40 are positioned in the formed recesses. The electrical input-output part 14 of the optical element and the conductor via 20 are electrically connected. In this case, the light transmitting member 52, the first mirror 50, the second mirror 60, and the light transmitting member 62 are also positioned in the recesses.

After that, a resin insulating layer is formed covering the optical element 10 and the optical waveguide 40 positioned in the recesses. The optical element 10 and the optical waveguide 40 are optically connected via the first mirror 50 and the light transmitting member 52.

The logic IC 70 is mounted on the first surface (2a) of the printed wiring board 2 via the solder bumps (72, 74). The solder bump 72 is electrically connected to the upper surface of the conductor via 20 exposed on the first surface (2a). As a result, the electrical path 80 (FIG. 2) between the optical element 10 and the logic IC 70 is formed.

The connector 30 is mounted on the second surface (2b) of the printed wiring board 2. The housing 34 of the connector 30 is secured to a lower side of the light transmitting member 62. The connector 30 and the optical waveguide 40 are optically connected via the second mirror 60 and the light transmitting member 62. As a result, the optical element 10 and the connector 30 are optically connected by the optical waveguide 40. The semiconductor package 1 of the embodiment is obtained.

First Modified Embodiment

Figure 3:
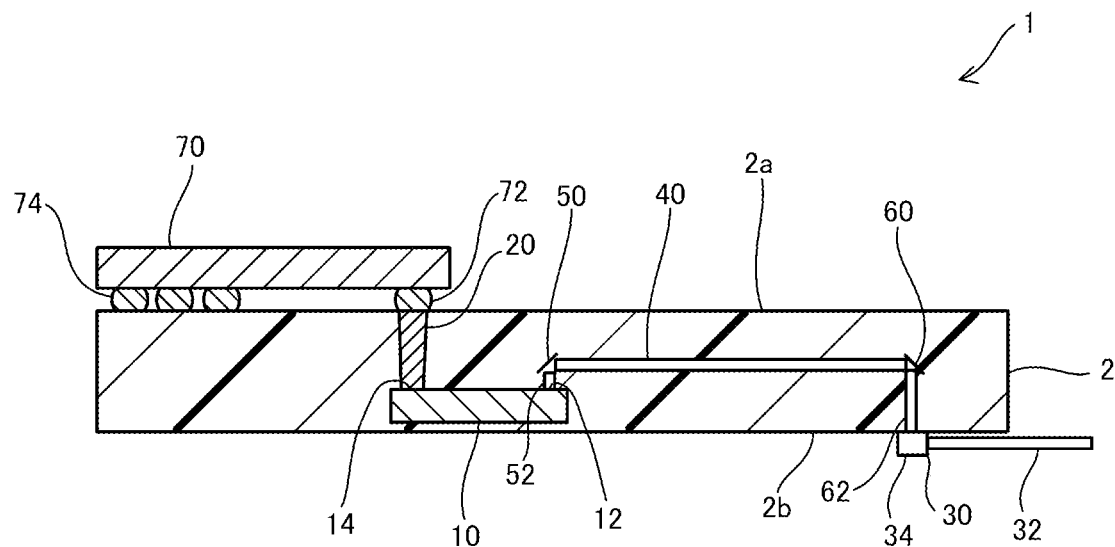
FIG. 3 is a cross-sectional view schematically illustrating a semiconductor package according to a first modified embodiment of the present invention.

FIG. 3 illustrates a first modified embodiment of the embodiment. The first modified embodiment is different from the embodiment in that the optical element 10 is completely embedded on the second surface (2b) side of the printed wiring board 2. Since the optical element 10 is completely embedded in the printed wiring board 2, the length of the electrical path (see "80" in FIG. 2) is slightly shorter than that in the embodiment. Also in the first modified embodiment, the length of the electrical path is 0.5 mm or more and 1.5 mm or less. Therefore, the semiconductor package 1 of the first modified embodiment exhibits substantially the same advantages as the semiconductor package 1 of the embodiment.

Second Modified Embodiment

Figure 4:
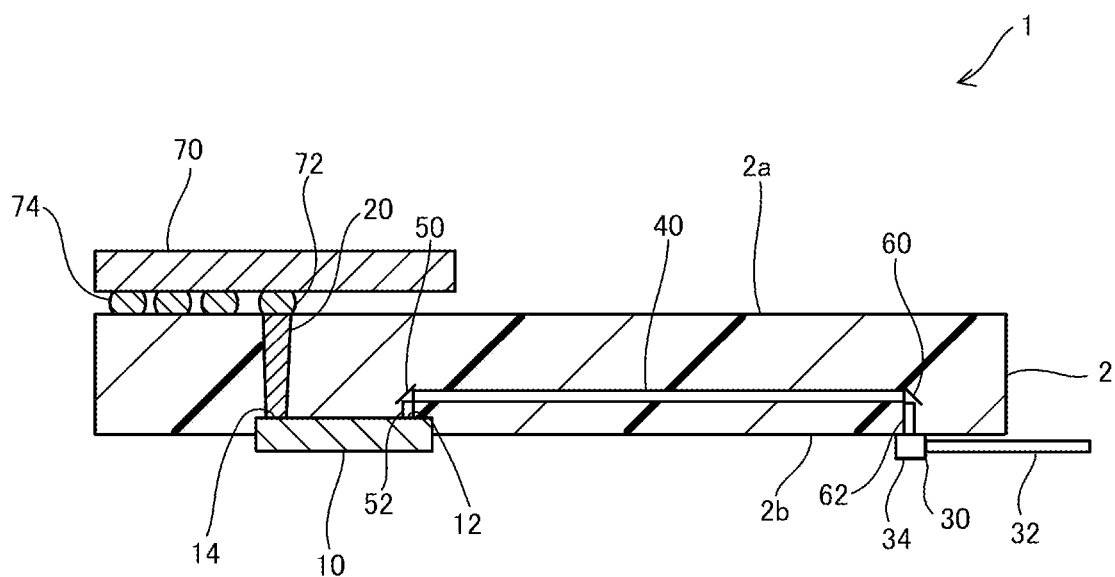
FIG. 4 is a cross-sectional view schematically illustrating a semiconductor package according to a second modified embodiment of the present invention.

FIG. 4 illustrates a second modified embodiment of the embodiment. The second modified embodiment is different from the embodiment in that the entire optical element 10 is positioned directly below the logic IC 70. When the logic IC 70 and the optical element 10 are projected onto the first surface (2a) with light perpendicular to the first surface (2a), the entire optical element 10 overlaps the logic IC 70. The semiconductor package 1 of the second modified embodiment exhibits substantially the same advantages as the semiconductor package 1 of the embodiment.

Another Embodiment of Second Modified Embodiment

Figure 5:
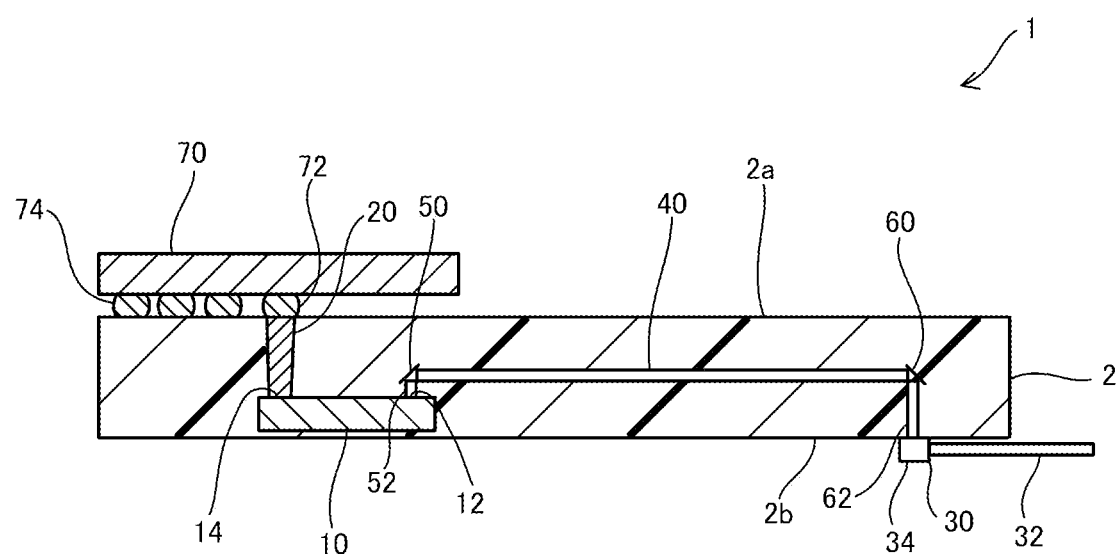
FIG. 5 is a cross-sectional view schematically illustrating a semiconductor package according to another embodiment of the second modified embodiment.

FIG. 5 illustrates another embodiment of the second modified embodiment. In the other embodiment of the second modified embodiment, the optical element 10 is completely embedded on the second surface (2b) side of the printed wiring board 2. The semiconductor package 1 according to the other embodiment of the second modified embodiment exhibits substantially the same advantages as the semiconductor package 1 of the second modified embodiment.

Third Modified Embodiment

In a third modified embodiment (not illustrated in the drawings), the optical element 10 and the optical waveguide 40 are optically connected without intervention of the first mirror 50 and the light transmitting member 52 (FIGS. 1-5). The optical input-output part 12 of the optical element 10 is formed on a side surface of the optical element 10. The optical waveguide 40 is positioned on a side of the optical element 10. The optical waveguide 40 extends along the second surface (2b). An end part of the optical waveguide 40 faces the optical input-output part 12 of the optical element 10. Therefore, the end part of the optical waveguide 40 and the optical input-output part 12 of the optical element 10 are optically connected without intervention of the first mirror 50.

Fourth Modified Embodiment

In a fourth modified embodiment (not illustrated in the drawings), the optical waveguide 40 and the connector 30 are optically connected without intervention of the second mirror 60 and the light transmitting member 62. An end part of the optical waveguide 40 is exposed to a part of the printed wiring board 2. It is not necessary for the optical waveguide 40 to be positioned parallel to the second surface (2b). The housing 34 of the connector 30 faces the exposed end part of the optical waveguide 40. Therefore, the end part of the optical waveguide 40 and the connector 30 are optically connected without intervention of the second mirror 60 and the light transmitting member 62.

Japanese Patent Application Laid-Open Publication No. 2002-329891 describes an IC chip mounting substrate in which an optical element and an IC chip are mounted on a surface of a substrate. An optical path for optical signal transmission that penetrates the substrate is formed in the substrate. An optical signal input to or output from the optical element is transmitted via the optical path for optical signal transmission. The optical element and the IC chip are electrically connected via solder connection parts, a conductor circuit, via holes, through holes or the like provided in the substrate. Therefore, an electrical signal is transmitted between the optical element and the IC chip via the solder connection parts, the conductor circuit, the via holes, the through holes, or the like.

In the IC chip mounting substrate of Japanese Patent Application Laid-Open Publication No. 2002-329891, the conductor circuit, the via holes, the through holes or the like provided in the substrate function as an electrical path between the optical element and the IC chip. However, in the structure of Japanese Patent Application Laid-Open Publication No. 2002-329891, since the electrical path is long (for example, about 200 mm), it is thought that a transmission loss of an electrical signal is large.

A semiconductor package according to an embodiment of the present invention includes: a printed wiring board that has a first surface and a second surface on the opposite side with respect to the first surface; a logic IC that is mounted on the first surface of the printed wiring board; an optical element that is positioned on the second surface side of the printed wiring board and converts an optical signal and an electrical signal; a path that is formed in the printed wiring board and electrically connects the logic IC and the optical element; a connector that is mounted on the second surface of the printed wiring board; and an optical waveguide that is embedded on the second surface side of the printed wiring board and optically connects the connector and the optical element. The optical element is at least partially embedded in the printed wiring board.

In a semiconductor package according to an embodiment of the present invention, the logic IC is mounted on the first surface and the optical element is positioned on the second surface side. The optical element is at least partially embedded in the printed wiring board. Therefore, for example, when the optical element is at least partially positioned directly below the logic IC, a length of an electrical path between the optical element and the logic IC is about the same as a thickness of the printed wiring board. In this case, the length of the electrical path is shorter than a length of an electrical path in a conventional semiconductor package. Therefore, according to the semiconductor package of the embodiment, a transmission loss is smaller than that of the conventional semiconductor package.

Obviously, numerous modifications and variations of the present invention are possible in light of the above teachings. It is therefore to be understood that within the scope of the appended claims, the invention may be practiced otherwise than as specifically described herein.

The invention claimed is:

1. A semiconductor package, comprising:
a printed wiring board;
a logic IC mounted on a first surface of the printed wiring board;
a connector mounted on a second surface of the printed wiring board on an opposite side of the printed wiring board with respect to the first surface;
an optical element configured to convert an optical signal and an electrical signal and positioned on the opposite side of the printed wiring board with respect to the first surface such that the optical element is at least partially embedded in the printed wiring board;
a path formed in the printed wiring board and configured to electrically connect the logic IC on the first surface of the printed wiring board and the optical element on the opposite side of the printed wiring board with respect to the first surface; and
an optical waveguide embedded on the opposite side of the printed wiring board with respect to the first surface and configured to optically connect the connector on the second surface of the printed wiring board and the optical element on the opposite side of the printed wiring board with respect to the first surface,
wherein the path is formed substantially straight and substantially perpendicular to the first surface of the printed wiring board, and the logic IC and the optical element are positioned such that the logic IC and the optical element at least partially overlap.

2. The semiconductor package according to claim 1, further comprising:
a mirror positioned to change a transmission direction of the optical signal between the optical element and the optical waveguide such that the optical element and the optical waveguide are optically connected via the mirror.

3. The semiconductor package according to claim 1, wherein an entire structure of the optical element is positioned directly below the logic IC.

4. The semiconductor package according to claim 2, further comprising:
a second mirror positioned to change a transmission direction of an optical signal between the connector and the optical waveguide such that the connector and the optical element are optically connected via the second mirror.

5. The semiconductor package according to claim 2, wherein the optical element is completely embedded in the printed wiring board.

6. The semiconductor package according to claim 2, wherein the optical waveguide has a length in a range of 30 mm to 70 mm.

7. The semiconductor package according to claim 2, wherein the path has a length in a range of 0.5 mm to 1.5 mm.

8. The semiconductor package according to claim 2, wherein the optical waveguide is formed parallel to the second surface of the printed wiring board.

9. The semiconductor package according to claim 1, further comprising:
a mirror positioned to change a transmission direction of an optical signal between the connector and the optical waveguide such that the connector and the optical element are optically connected via the mirror.

10. The semiconductor package according to claim 1, wherein the optical element is completely embedded in the printed wiring board.

11. The semiconductor package according to claim 1, wherein the optical waveguide has a length in a range of 30 mm to 70 mm.

12. The semiconductor package according to claim 1, wherein the path has a length in a range of 0.5 mm to 1.5 mm.

13. The semiconductor package according to claim 1, wherein the optical waveguide is formed parallel to the second surface of the printed wiring board.

14. The semiconductor package according to claim 2, wherein an entire structure of the optical element is positioned directly below the logic IC.

15. A semiconductor package, comprising:
a printed wiring board;
a logic IC mounted on a first surface of the printed wiring board;
a connector mounted on a second surface of the printed wiring board on an opposite side of the printed wiring board with respect to the first surface;
an optical element configured to convert an optical signal and an electrical signal and positioned on the opposite side of the printed wiring board with respect to the first surface such that the optical element is at least partially embedded in the printed wiring board;
a path formed in the printed wiring board and configured to electrically connect the logic IC on the first surface of the printed wiring board and the optical element on the opposite side of the printed wiring board with respect to the first surface;
an optical waveguide embedded on the opposite side of the printed wiring board with respect to the first surface and configured to optically connect the connector on the second surface of the printed wiring board and the optical element on the opposite side of the printed wiring board with respect to the first surface; and
a plurality of mirrors comprising a first mirror positioned to change a transmission direction of the optical signal between the optical element and the optical waveguide such that the optical element and the optical waveguide are optically connected via the mirror, and a second mirror positioned to change a transmission direction of an optical signal between the connector and the optical waveguide such that the connector and the optical element are optically connected via the second mirror.

16. The semiconductor package according to claim 15, wherein the optical element is completely embedded in the printed wiring board.

17. The semiconductor package according to claim 15, wherein the optical waveguide has a length in a range of 30 mm to 70 mm.

18. The semiconductor package according to claim 15, wherein the path has a length in a range of 0.5 mm to 1.5 mm.

19. The semiconductor package according to claim 15, wherein the optical waveguide is formed parallel to the second surface of the printed wiring board.

20. The semiconductor package according to claim 15, wherein an entire structure of the optical element is positioned directly below the logic IC.

* * * * *